United States Patent [19]

Matsumoto et al.

[11] 4,116,752

[45] Sep. 26, 1978

[54] PRODUCTION OF SINGLE CRYSTALLINE FERRITE PARTICLES

[75] Inventors: Seiji Matsumoto; Kiyoshi Fukai, both of Sakai, Japan

[73] Assignee: Sakai Chemical Industry Co., Ltd., Sakai, Japan

[21] Appl. No.: 472,740

[22] Filed: May 23, 1974

[30] Foreign Application Priority Data

Mar. 1, 1974 [JP] Japan .................................. 49-23938

[51] Int. Cl.$^2$ ..................... B01J 17/06; C01G 49/02; C01F 11/00
[52] U.S. Cl. ........................... 156/624; 156/DIG. 74; 156/DIG. 78; 23/305 F; 423/594
[58] Field of Search .................. 23/299, 300, 296, 297, 23/309, 305, DIG. 1, 305 F; 423/594; 156/624, DIG. 74, DIG. 78

[56] References Cited

U.S. PATENT DOCUMENTS

| | | | |
|---|---|---|---|
| 1,471,751 | 10/1923 | Rankin | 23/DIG. 1 |
| 1,821,208 | 9/1931 | Dahlberg | 23/DIG. 1 |
| 1,940,409 | 12/1933 | Fink | 23/DIG. 1 |
| 2,762,778 | 9/1956 | Gortner et al. | 423/594 |
| 3,049,404 | 9/1962 | Wade | 423/594 |
| 3,113,109 | 12/1963 | Brixner | 423/594 |
| 3,115,469 | 12/1963 | Hamilton | 423/594 |
| 3,117,934 | 1/1964 | Linares | 23/300 |
| 3,414,372 | 12/1968 | Paulus et al. | 23/300 |
| 3,630,667 | 4/1969 | Shirk | 423/594 |
| 3,697,320 | 10/1972 | Hiskes | 23/300 |
| 3,794,720 | 2/1974 | Nye | 423/594 |
| 3,804,767 | 4/1974 | Tombs et al. | 423/594 |
| 3,810,973 | 5/1974 | Arendt et al. | 423/594 |

OTHER PUBLICATIONS

Hilpert: "The Preparation of Magnetic Oxides of Iron", pp. 65-68.

*Primary Examiner*—Frank Sever
*Attorney, Agent, or Firm*—Haight & Huard

[57] ABSTRACT

Single crystalline, ferrite particles are obtained by the thermal reaction of ferric oxyhydroxide, ferric hydroxide, porous ferric oxide made therefrom or ferric oxide having a particle size less than 0.8μ with a strontium or barium compound such as the oxide, hydroxide, the carbonate or the carboxylate in the presence of a small amount of a metal chloride flux such as strontium chloride or barium chloride.

The resulting particles have a well-defined, hexagonal plate configuration and are particularly adapted for the production of anisotropic magnets.

13 Claims, No Drawings

PRODUCTION OF SINGLE CRYSTALLINE FERRITE PARTICLES

This invention relates to a method for producing single crystal of ferrite. More particularly it relates to a method for producing single crystal particles of strontium ferrite, $SrO \cdot 6Fe_2O_3$; or barium ferrite $BaO \cdot 6Fe_2O_3$ in the form of fine, hexagonal plates.

It has been known that single crystal particles of strontium ferrite or barrium ferrite having substantially the stoichiometric composition corresponding to $M^{II}O \cdot 6Fe_2O_3$ ($M^{II}$ = Sr or Ba), when the crystals are well-defined in the form of thin, hexagonal plates having a substantially uniform particle size equal to or less than the single domain of the individual crystals, have a variety of important uses such as materials for producing anisotropic ferrite magnets, plastic-bonded magnets, ferroxplana type ferrites, magnetic tapes, X-ray contrasts or the like. As materials for producing plastic-bonded ferrite magnets, it is essential that the particles are freely dispersible in the binder and may easily be longitudinally oriented in planes perpendicular to the magnetization axis during the shaping or moulding process with or without applying a magnetic field so that anisotropy is imparted to the finished magnet.

Conventionally ferrites are produced by heating ferric oxide and strontium or barium carbonate in a furnace at a higher temperature, but this method does not give a product which may be used for the above-mentioned purposes.

It has been known that fine particles of ferrite may be produced by a hydrothermal reaction of the components. Since this reaction requires a high pressure, long periods of time and a special apparatus, this method may hardly be practiced on a large scale.

It is an object of the present invention to provide a method for producing single crystal particles of strontium or barium ferrite which may overcome the above-mentioned disadvantages in the prior art.

Another object of the present invention is to provide a method for producing the single crystal ferrite partices in the form of fine, well-defined hexagonal plates about $0.5\mu$ to about $2.0\mu$ in diameter and less than about one fourth in thickness of the diameter.

Still another object of the present invention is to provide a method for producing such ferrite particles which is especially adapted for use in the production of anisotropic plastic or rubber-bonded ferrite magnets.

Further objects and advantages of the present invention will be apparent from the following description.

According to the present invention, we have found that fine particles of single crystals of strontium- or barium ferrite may be economically produced with the use of a reactive iron compound such as ferric oxyhydroxide, ferric hydroxide, porous ferric oxide made therefrom, ferric oxide having a particle size less than $0.8\mu$ or the like as the starting material when the thermal reaction thereof with a strontium or barium compound such as the oxide, the hydroxide, the carbonate or the carboxylate is carried out in the presence of a flux such as strontium chloride or barium chloride. Preferable molar ratio of the iron compound to the metal carbonate, when calculated in terms of ferric oxide, is from about 4.3 to 6.5, more preferably about 5.0 to 6.0 and the molar ratio of the flux is at least 0.05, preferably about 0.15 to 2. The starting mixture containing the flux is heated at a temperature between the melting point of the flux and 1300° C, preferably from 870° C to 1200° C and then cooled. The resulting cake is extracted with water to remove soluble matter.

As the reactive iron compound, ordinary type of ferric oxide can be used satisfactorily provide that the particle size thereof is less than $0.8\mu$. Thus, ferric oxide containing chloride ions such as those made from waste polishing solutions of iron products can be used without removing chloride ions. Examples of other reactive iron compounds are ferric oxyhydroxide such as $\alpha$-FeOOH (goethite), ferric hydroxide, or porous ferric oxide made by the calcination thereof. When an ordinary type of ferric oxide such as of pigment grade is used, the particle size thereof must be less than $0.8\mu$ to give a satisfactory results. Greater particle size of the ferric oxide require a higher reaction temperature which results in the formation of overly grown crystals or agglomeration of crystals formed.

The particle size of strontium or barium compound is not critical because they may easily be dispersed in the reaction system uniformly by the action of the flux.

The amounts of the above-mentioned iron compound and the strontium or barium compound may be stoichiometric ratio, namely 6 moles of the ferric oxide to 1 mole of strontium or barium compound. However, the use of slightly excess amounts of strontium or barium compound gives better results as recognized in the prior art. In this connection, from 4.3 to 6.5, most preferably from about 5.0 to 6.0 moles of the iron compound in terms of ferric oxide are mixed with 1 mole of the strontium or barium compound. The use of said iron compound in such an amount greater than 0.5 moles or less than 4.3 moles in terms of ferric oxide is not satisfactory as it decreases the magnetic properties of the product.

The above-mentioned reactants may conveniently mixed by any conventional means such as dry process or wet process. During this step, strontium chloride or barium chloride is added to the mixture as a flux. It has been found that the amount of flux should be at least 0.05 moles based on the quantity of the strontium or barium compound for carrying out the present invention effectively. The upper limit is a question of economy. Preferably 0.15 to 2 moles of the chloride is sufficient for practicing the present invention effectively, though much greater amounts can be employed. The chloride may be added and thoroughly mixed with the mixture of the reactants either in the form of a solution or powder.

The resulting mixture is then reacted by heating. The mixture of reactants and the flux may be subjected to the reaction either in the form of a powder or pellets less than 5cm in diameter. The reaction of the present invention may proceed effectively at a temperature slightly higher than the melting point of the flux used. These reaction temperatures are about 300° C lower than that required in the prior art solid reactions. Strontium chloride which melts at 870° C has an advantage that the reaction may take place relatively low temperature and the resulting products have a relatively thin hexagonal plate configuration. Barium chloride which melts at 960° C also has an advantage that it gives a relatively uniform particle size. It should be noted that mixtures of strontium chloride and barium chloride melt at a temperature lower than the melting point of each component due to the melting point depression. The upper limit of the reaction temperature is about 1300° C. At a temperature above 1300° C, not only the significance of the present invention will be lost but also volatilization of the flux or over-growing of the crystals will take place. Therefore, it is preferable to carry out the reaction at a temperature between about 870° C and 1200° C.

After heating for a sufficient length of time to complete the reaction, the mixture is cooled. The resulting product is a cake comprising fine particles of ferrite crystals and soluble flux intervened therebetween. The cake can be easily dispersed into individual particles by extracting soluble matter with water. This can be preferably achieved by milling the cake in water. However, grinding particles into a size less than the single domain, as required in the prior art, is unnecessary at all. The resulting product is washed with water and dried to obtain the finished product.

The extracts and washings are processed to recover strontium chloride or barium chloride therefrom which may be returned to a subsequent cycle of the operation.

The products thus obtained are fine particles of single crystals of strontium ferrite, barium ferrite or the binary crystals thereof having a thin, substantially hexagonal plate configuration. Particles having more well-defined configuration are obtained by the use of ferric oxide having porous, uneven surface structure or materials capable of forming such surface structure upon heating. Examples of such materials are ferric oxyhydroxide such as α-FeOOH (goethite), ferric hydroxide or the ferric oxide prepared by the calcination thereof. α-FeOOH, for instance, is commercially available in large quantities as a yellow pigment in the market and generally occurs as fine needles having $0.2 - 1.2\mu$ in length and $0.02 - 0.2\mu$ in width. With the use of said materials, the average size of the resulting ferrite crystals may preferably be controlled within the range of 0.5 to $2.0\mu$ in the longitudinal diameter and less than one fourth in thickness by controlling the particle size of the above-mentioned starting iron compounds. Still finer particles having, for example, the longitudinal diameter of about $0.5\mu$ are obtained by the use of colloidal ferric hydroxide which is preferably prepared by the co-precipitation with strontium carbonate or barium carbonate from aqueous solutions containing the corresponding metallic ions.

Ordinary ferric oxide of the red ferric oxide type gives slightly thicker hexagonal plates in shape.

The ferrite particles produced by the method according to the present invention are particularly adapted for the production of anisotropic ferrite magnets. In this connection, individual crystals may easily oriented when mechanical force is applied during the shaping operations, since the crystals are flat in a perpendicular plane relative to the axis of easy magnetization. Thus a sintered magnet having an excellent anisotropy can be produced from the ferrite particles made by the present invention with or without applying magnetic field during the shaping operation. A plastic or rubber magnet having excellent magnetic properties may also be obtained from the products of the present invention. The ferrite particles are blended with natural or synthetic rubber, or plastics such as chlorinated polyethylene in a conventional manner and the mixture is shaped in a conventional manner such as calendering, moulding, extruding or the like. During this shaping operation, the particles are mechanically oriented in planes parallel to their longitudinal axis. Thus, the degree of orientation will reach greater than 95% without any difficulty, whereas the products obtained by the prior art can reach 65 to 70% only.

Although the above description is made with reference to a specific preferred embodiment of the invention, various modifications are possible without departing from the principle of the present invention. Thus trace of various metals such as Si, Al, Ca, Pb or Bi may be added to the ferrite to improve the property thereof as the conventional ferrite production.

Though strontium carbonate or barium carbonate is preferable as the starting material, the oxide, the hydroxide or the carboxylate such as the formate, acetate, oxalate and the like may also be used. Furthermore, they may be produced in situ in such proportions as required for the reaction. For example, the carbonate or hydroxide may be replaced by equivalent amounts of additional strontium or barium chloride and an alkali metal carbonate or hydroxide such as sodium carbonate, sodium hydroxide, potassium carbonate or potassium hydroxide.

Strontium chloride or barium chloride may also be formed in situ by adding an equivalent amount of hydrochloric acid to the above-mentioned starting strontium or barium compound.

The following examples are offered for illustrative purposes only, and are not intended to limit the scope of the present invention, which is defined in the claims below.

EXAMPLE 1

2 kg of ferric oxide having an average particle size of $0.2\mu$ containing 1.2% of chloride ions (crude ferric oxide prepared from waste polishing solutions of iron products containing ferric chloride) was admixed with 330g of strontium carbonate (chemically pure grade) in a mill. To the mixture was added a solution of 680g of strontium chloride hexahydrate in 1 liter of water. The resulting mass was pelletized to about 20 mm in diameter and then dried. The pellets were placed in a refractory container and fired for 1 hour at 1075° C. After cooling, the resulting cake was crushed, added to 2 liters of warm water and dispersed in water while milling. The resulting mud was filtered, washed with water to remove strontium chloride and dried, whereby fine particles of hexagonal plates of strontium ferrite having an average particle size (longitudinal diameter) of about $1.5\mu$ were obtained.

180g of the resulting ferrite particles was blended with 20.6g of chlorinated polyethylene and 3g of dioctyl phthalate in a roll mill and the mixture was extended to a sheet of 1mm in thickness. The sheet showed an orientation degree of particles of 95%, a residual magnetic flux density Br=2800 G and a coercive force $_BMc=1800$ Oe relative to the perpendicular direction to the surfaces of the sheet respectively.

EXAMPLE 2

The procedure of Example 1 was repeated using 2 kg of ferric oxide having an average particle size of $0.3\mu$, 490 g of barium carbonate and an aqueous solution of 300 g of barium chloride dihydrate in 1 liter of warm water to obtain the same size of pellets. The pellets were fired for 1 hour at 1100° C followed by the same procedures as Example 1, whereby fine particles of barium ferrite having an average particle size (longitidinal diameter) of about $1.5\mu$ were obtained.

A test piece of plastic-bonded magnet was made as the same manner of Example 1. The sheet showed a residual magnetic flux density Br=2800G, and a coercive force $_BHc=2700$ Oe relative to the perpendicular direction to the surfaces of the sheet respectively.

EXAMPLE 3

The procedure of Example 1 was repeated using 2 kg of ferric oxide having an average particle size of $0.2\mu$, 360g of strontium carbonate and an aqueous solution of 300g of barium chloride dihydrate to obtain the same size of pellets. The pellets were fired for 1 hour at 1100° C followed by the same procedures as Example 1, whereby fine particles of strontium ferrite having average particle size (longitudinal diameter) of about $1\mu$ were obtained.

A test piece of plastic-bonded magnet was made as the same manner of Example 1. The sheet showed a residual magnetic flux density Br=2800, and a coercive force $_BHc=2800$ Oe relative to the perpendicular direction to the surfaces of the sheet respectively.

EXAMPLE 4

90g of fine needles of $\alpha$-FeOOH (goethite) having an average particle size of $0.4\mu$ in length and $0.05\mu$ in width, 14.9g of strontium carbonate having an average particle size of $0.3\mu$ and 200g of strontium chloride hexahydrate were thoroughly mixed. The mixture was filled in a refractory container and heated in an electric furnace at 1000° C for 10 minutes in the atmosphere. The reaction mixture was withdrawn from the furnace when it was cooled at 800° C and cooled rapidly. The resulting cake was added to 500ml of water and the mixture was stirred whereby a dispersion of the resulting ferrite particles was obtained. The particles was filtered off, washed with water and dried, whereby fine particles of single crystals of strontium ferrite having a hexagonal plate configuration of $2.0 - 2.5\mu$ in diameter and $0.1 - 0.2\mu$ in thickness. No agglomeration of individual particles were observed but the particles were easily dispersed.

EXAMPLE 5

90g of fine needles of $\alpha$-FeOOH having an average particle size of $0.9\mu$ in length of $0.2\mu$ in width, 14g of strontium carbonate having an average particle size of $0.8\mu$ and 100g of strontium chloride hexahydrate were thoroughly mixed. The mixture was heated at 1150° C for 15 minutes in the atmosphere and treated by the same manner as in Example 4, whereby easily dispersible fine particles of hexagonal plates of strontium ferrite were obtained. The particle size of the product was $10 - 15\mu$ in diameter and $0.8 - 1.5\mu$ in thickness.

EXAMPLE 6

264g of ferric nitrate nonahydrate and 14.5g of strontium chloride hexahydrate were dissolved in 1 liter of water. To the solution were added 500 ml of 28% aqueous solution of ammonia and a solution of 7g of $(NH_4)_2CO_3 \cdot H_2O$ in 1 liter of water with stirring. The resulting mixture of ferric hydroxide and strontium carbonate precipitates was filtered off, washed with water and dried. The precipitates were finely divided and then mixed thoroughly with 80g of strontium chloride hexahydrate. The mixture was heated at 980° C for 15 minutes in the atmosphere and treated by the same manner as in Example 4, whereby extremely fine particles of hexagonal plates of strontium ferrite having particle size of $0.5\mu$ in diameter and $0.1\mu$ in thickness were obtained.

EXAMPLE 7

1.2 liters of 1 M aqueous solution of ferric chloride and 800 ml of 1 M aqueous solution of barium hydroxide were mixed. To the mixture was bubbled ammonia gas to precipitate ferric hydroxide. A solution of 11.5g of $(NH_4)_2CO_3 \cdot H_2O$ in water was added to the mixture with stirring and the mixture was concentrated to dryness. The resulting precipitates were finely divided and heated at 1250° C for 20 minutes in the atmosphere and treated by the same manner as in Example 4, whereby fine particles of hexagonal plates of barium ferrite having particle size of $2 - 5\mu$ in diameter and $0.5 - 1.0\mu$ in thickness were obtained.

EXAMPLE 8

2 kg of needles of $\delta$-FeOOH having an average particle size of $0.6\mu$ in length, 1.2 kg of strontium chloride hexahydrate and 174 kg of sodium hydroxide powder were thoroughly mixed in a mill. The mixture was filled in a porcelain pot and heated in an electric furnace at 890° C for 1 hour. After cooling, the resulting cake was crushed added to 2 liters of warm water, and dispersed in water while milling. The resulting mud was filtered, washed with water to remove soluble matters and dried, whereby fine particles of strontium ferrite were obtained.

A test piece of plastic-bonded magnet was made as the same manner of Example 1. The sheet showed a residual magnetic flux density Br=2800 G, and a coercive force $_BHc=2200$ Oe respectively.

EXAMPLE 9

2 kg of ferric oxide having an average particle size of $0.2\mu$, 760g of barium chloride dihydrate, and 287g of potassium carbonate were thoroughly mixed in a mill. The mixture was pelletized to about 20 mm in diameter. The pellets were filled in a porcelain pot, heated in an electric furnace at 1180° C for 1 hour followed by the same procedures as Example 1.

A test piece of plastic-bonded magnet was made from the resulting ferrite particles as the same manner of Example 1. The sheet showed a residual magnetic flux density Br=2700 G, and a coercive force $_BHc=2600$ Oe respectively.

Various other examples and modifications of the foregoing examples can be devised by the person skilled in the art after reading the foregoing disclosure and the appended claims without departing from the spirit and scope of the invention. All such further examples and modifications thereof are included within the scope of said claims.

What is claimed is:

1. A method for producing single crystal strontium ferrite or barium ferrite particles in the form of hexagonal plates about $0.5\mu$ to $2.0\mu$ in diameter and less than about one-fourth of said diameter in thickness, which comprises:
    (a) reacting an admixture of
        (i) about 4.3 to 6.5 moles, expressed as ferric oxide, of an iron compound selected from the group consisting of ferric hydroxide, ferric oxyhydroxide, calcined porous ferric oxide and ferric oxide having a particle size less than about $0.8\mu$;
        (ii) about one mole, expressed as metal oxide, of at least one metal compound selected from the group consisting of the oxides, hydroxides, carbonates and carboxylates of strontium and barium; and
(iii) about 0.05–2 moles of a metal chloride flux selected from the group consisting of strontium chloride, barium chloride and mixtures thereof, at a temperature between the melting point of said metal chloride flux and 1300° C. to form said strontium ferrite or barium ferrite particles having the stoichiometric composition $MO \cdot 6\ Fe_2O_3$ wherein M is divalent strontium or barium;

(b) cooling the resultant reaction mixture to form a cake comprising said single crystal ferrite particles and water soluble flux intervened therebetween; and (c) extracting said water-soluble flux from said particles.

2. A method according to claim 1, wherein said iron compound is ferric oxyhydroxide.

3. A method according to claim 1, wherein said iron compound is ferric hydroxide.

4. A method according to claim 1, wherein said iron compound is ferric oxide having a particle size less than about $0.8\mu$.

5. A method according to claim 1, wherein said metal compound is a carbonate.

6. A method according to claim 5, wherein said carbonate is strontium carbonate.

7. A method according to claim 5, wherein said carbonate is barium carbonate.

8. A method according to claim 1, wherein said metal compound is a hydroxide.

9. A method according to claim 1, wherein said metal chloride is strontium chloride.

10. A method according to claim 1, wherein said metal chloride is barium chloride.

11. A method according to claim 1, wherein said admixture contains about 5.0–6.0 moles of said iron compound.

12. A method according to claim 1, wherein said admixture is heated to a temperature of about 870° to 1200° C.

13. A method according to claim 1, wherein said admixture contains about 5.0–6.0 moles of said iron compound and 0.15–2 moles of said metal chloride, said metal compound is a carbonate or hydroxide, the admixture is heated to a temperature of about 870° to 1200° C. and said water-soluble flux is extracted by milling said cake in water.

* * * * *